(12) United States Patent
Ganbe et al.

(10) Patent No.: US 9,051,450 B2
(45) Date of Patent: Jun. 9, 2015

(54) RESIN COMPOSITION

(71) Applicant: FUJI ELECTRIC CO., LTD., Kawasaki-shi (JP)

(72) Inventors: Tatsuya Ganbe, Asaka (JP); Yuji Takematsu, Hino (JP); Kenji Okamoto, Hachioiji (JP)

(73) Assignee: FUJI ELECTRIC CO., LTD. (JP)

( * ) Notice: Subject to any disclaimer, the term of this patent is extended or adjusted under 35 U.S.C. 154(b) by 114 days.

(21) Appl. No.: 13/738,153

(22) Filed: Jan. 10, 2013

(65) Prior Publication Data

US 2013/0105929 A1 May 2, 2013

Related U.S. Application Data

(63) Continuation of application No. PCT/JP2011/072435, filed on Sep. 29, 2011.

(30) Foreign Application Priority Data

Oct. 1, 2010 (JP) .................. 2010-223685

(51) Int. Cl.
*H01L 23/22* (2006.01)
*H01L 21/00* (2006.01)
(Continued)

(52) U.S. Cl.
CPC .............. *C08K 3/36* (2013.01); *H01L 31/0216* (2013.01); *C08G 59/32* (2013.01); *C08K 3/0033* (2013.01); *C08K 3/22* (2013.01); *C08K 3/28* (2013.01); *C08K 3/38* (2013.01); *C08L 63/00* (2013.01); *H01L 23/295* (2013.01); *H01L 23/3107* (2013.01); *H01L 21/561* (2013.01); *H01L 23/291* (2013.01); *H01L 31/0203* (2013.01); *H01L 2224/32245* (2013.01); *H01L 2224/48137* (2013.01); *H01L 2224/48247* (2013.01); *H01L 2224/73265* (2013.01);
(Continued)

(58) Field of Classification Search
CPC ........ C08G 59/32; C08K 3/0033; C08K 3/22; C08K 3/28; C08K 3/38; H01L 23/295; H01L 21/563; H01L 31/0216; H01L 31/0203
See application file for complete search history.

(56) References Cited

U.S. PATENT DOCUMENTS 6,943,433 B2 * 9/2005 Kamada ..................... 257/666
8,212,271 B2 * 7/2012 Kotani et al. ................ 257/98
(Continued)

FOREIGN PATENT DOCUMENTS

CN 101033379 A 9/2007
CN 101338187 A 1/2009
(Continued)

OTHER PUBLICATIONS

Japanese Office Action Japanese counterpart application No. JP2012-536565, dated Mar. 7, 2014. English translation provided.
(Continued)

*Primary Examiner* — Alonzo Chambliss
(74) *Attorney, Agent, or Firm* — Rossi, Kimms & McDowell LLP

(57) ABSTRACT

A resin composition for obtaining a cured resin material exhibiting improved heat resistance and a higher glass transition temperature is disclosed. The resin composition contains a resin selected from a) a thermosetting resin and a curing agent, or b) a thermoplastic resin, and an inorganic filler with an average particle diameter of 1000 nm or less.

17 Claims, 1 Drawing Sheet

(51) Int. Cl.
*C08K 3/36* (2006.01)
*H01L 31/0216* (2014.01)
*C08G 59/32* (2006.01)
*C08K 3/00* (2006.01)
*C08K 3/22* (2006.01)
*C08K 3/28* (2006.01)
*C08K 3/38* (2006.01)
*C08L 63/00* (2006.01)
*H01L 23/29* (2006.01)
*H01L 21/56* (2006.01)
*H01L 31/0203* (2014.01)
*H01L 31/048* (2014.01)
*H01L 23/31* (2006.01)

(52) U.S. Cl.
CPC ............ *H01L 2924/13091* (2013.01); *H01L 2224/45124* (2013.01); *H01L 31/048* (2013.01); *H01L 2924/13055* (2013.01); *Y02E 10/50* (2013.01); *H01L 2924/1305* (2013.01)

(56) References Cited

U.S. PATENT DOCUMENTS 8,492,909 B2    7/2013  Okamoto et al.

2007/0213429 A1    9/2007  Cheng et al.
2009/0032976 A1*   2/2009  Misumi et al. ............... 257/787
2009/0168141 A1    7/2009  Nakashima et al.
2010/0038670 A1*   2/2010  Panaccione et al. ........... 257/98
2010/0059872 A1*   3/2010  Katsurayama ................ 257/686
2012/0146248 A1*   6/2012  Nishihata ..................... 257/789
2012/0153513 A1*   6/2012  Toyoda et al. ................ 257/793

FOREIGN PATENT DOCUMENTS

JP    2005-251563 A    9/2005
JP    2006-249276 A    9/2006
JP    2008-063449 A    3/2008
JP    2009-013227 A    1/2009
JP    2009-292866 A    12/2009

OTHER PUBLICATIONS

Chinese Office Action Chinese counterpart application No. CN201180034396.6, dated May 26, 2014. English translation provided.

Kenji Okamoto, et al.; "Nanocomposite Epoxy Resin for SiC Module", 5 pages, Tokyo, Japan.

* cited by examiner (a) 
(b) 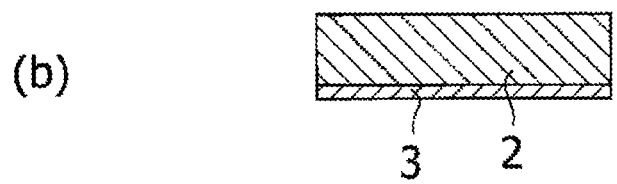
(c) 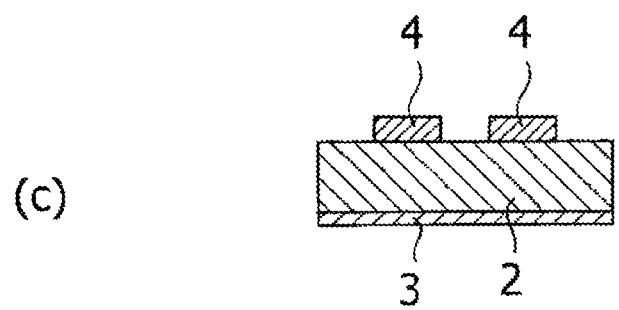
(d) 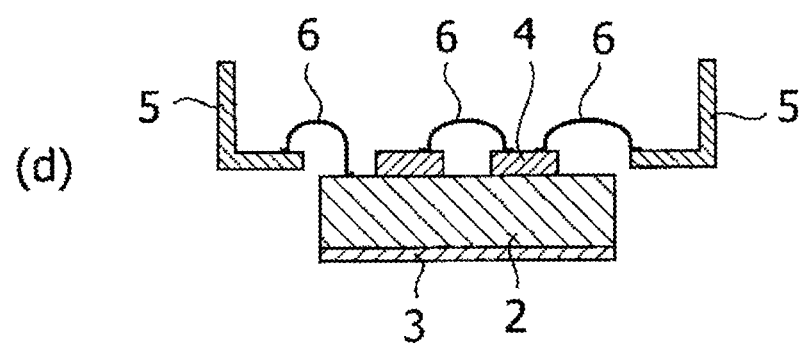
(e) 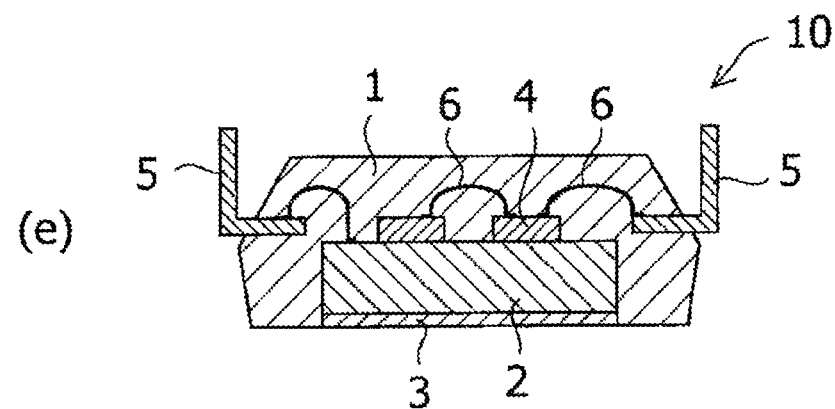

RESIN COMPOSITION

BACKGROUND OF THE INVENTION

A. Field of the Invention

The present invention relates to a resin composition capable of yielding a cured resin material exhibiting improved heat resistance and a higher glass transition temperature.

B. Description of the Related Art

In recent years, IGBTs (insulated-gate bipolar transistors), MOSFETs (metal oxide semiconductor field-effect transistors) and other power modules capable of operating at large capacities in high-voltage environments have been used widely in consumer appliances and industrial machines. In some of these various modules using semiconductor elements (hereunder called "semiconductor modules"), the heat generated by the mounted semiconductor element can reach high temperatures. This can occur when the semiconductor element operates at a high power level, when the circuits in the semiconductor element are highly integrated, or when the circuits have a high operating frequency. In such cases, the insulating sealing resin in the semiconductor module must have a glass transition temperature (Tg) equal to or greater than the exothermic temperature.

To impart heat resistance to cured epoxy resin materials used as insulating sealing resins, the molecular structures of conventional epoxy resins have been selected, and crosslinking densities have been increased in an effort to increase the Tg and improve the heat resistance of the cured material. However, methods of improving heat resistance by altering the molecular structure of the epoxy resin or increasing the crosslinking density may adversely affect the viscosity characteristics, hygroscopicity and other essential properties of insulating sealing resins.

A resin composition is also known comprising silica fine particles, a bifunctional epoxy resin, a polyfunctional epoxy resin and an amine curing agent as essential components, which is an epoxy resin composition for a fiber reinforced composite providing high mechanical strength in high-temperature environments (Japanese Patent Application Publication No. 2009-292866). However, the problem is that the desired physical characteristics of the fiber-reinforced composite are obtained when the resin composition is impregnated in reinforcing fibers and then cured, and in this configuration it could not be used as an insulating sealing resin composition for sealing semiconductor elements and other electronic components.

Resins such as these that have insulating properties are also widely used for insulation and internal protection in fuel cells, photovoltaic cells and other electrical components and products, which are devices in which the generated heat may reach high temperatures, and a high glass transition temperature is also desirable for such applications.

The present invention is directed to overcoming or at least reducing the effects of one or more of the problems set forth above.

SUMMARY OF THE INVENTION

The present invention provides a resin composition whereby a cured resin material with improved heat resistance and a higher glass transition temperature can be obtained with the original molecular structure of the resin. A semiconductor module sealed with this resin composition also is provided.

One embodiment of the present invention is a resin composition comprising a resin selected from a) a thermosetting resin and a curing agent, or b) a thermoplastic resin, and an inorganic filler having an average particle diameter of 1000 nm or less. The mixing ratio of the inorganic filler in the resin composition is preferably 0.1 to 10 wt % based on the total mass of the resin composition. Preferably the inorganic filler is at least one selected from the group consisting of $Al_2O_3$, $SiO_2$, BN, AlN and $Si_3N_4$, with an average particle diameter of 1 to 1000 nm.

Moreover, the resin preferably is a thermosetting resin and a curing agent, where the thermosetting resin is an epoxy resin while the curing agent is an acid anhydride curing agent or a curing agent containing a molecule having one or more of the functional groups —$NH_3$, —$NH_2$ and —NH in a molecular structure thereof, and the inorganic filler preferably has an average particle diameter of 100 nm or less. In particular, the epoxy resin is preferably a trifunctional epoxy resin.

Another aspect of the present invention provides a cured nanocomposite resin material, obtained by thermosetting the aforementioned resin composition in which the resin is a thermosetting resin and a curing agent. The filler is preferably spaced at an average inter-filler distance of 1 to 200 nm.

In another preferred embodiment, the resin is a thermoplastic resin, the thermoplastic resin is a nylon, and the inorganic filler has an average particle diameter of 1000 nm or less. Another aspect of the present invention is a cured nanocomposite resin material, obtained by curing the aforementioned resin composition in which the resin is a thermoplastic resin. An average inter-filler distance of 1 to 2000 nm is particularly desirable.

Another aspect of the present invention provides a semiconductor module, obtained by using the aforementioned resin composition to seal an assembly including a metal block, an insulating layer pasted over one surface of the metal block, and at least one circuit element mounted on the other surface of the metal block. Sealing in use of the resin composition is preferably accomplished by any of potting, transfer molding and liquid transfer molding.

The insulating layer is preferably of an insulating material containing an epoxy resin, a first inorganic filler having an average particle diameter of 1 to 99 nm and dispersed in the epoxy resin and a second inorganic filler having an average particle diameter of 0.1 to 100 microns and dispersed in the epoxy resin, wherein the first and second inorganic fillers are each independently at least one selected from the group consisting of $Al_2O_3$, $SiO_2$, BN, AlN and $Si_3N_4$, and the mixing ratios of the first and second inorganic fillers in the insulating material are 0.1 to 7 wt % and 80 to 95 wt %, respectively.

Another aspect of the present invention provides a method for manufacturing a semiconductor module, including: a step of pasting an insulting layer on one surface of a metal block; a step of mounting at least one circuit element on the other surface of the metal block; and a step of using the aforementioned resin composition to seal an assembly obtained by mounting the circuit element. The sealing step is preferably performed by any method selected from potting, transfer molding, liquid transfer molding, compression molding and injection molding.

This resin composition of the present invention preferably is used for insulation and internal protection of an electrical component including a semiconductor module and a photovoltaic cell, and is preferably used for insulating and sealing a semiconductor module in particular.

Another embodiment of the present invention is an insulating sealing resin composition for semiconductor modules, comprising an epoxy resin, an acid anhydride curing agent or a curing agent containing a molecule having one or more of the functional groups —$NH_3$, —$NH_2$ and —NH in its molecular structure, and an inorganic filler with an average particle diameter of 100 nm or less. The mixing ratio of the organic filler in this resin composition is preferably 0.1 to 10 wt % based on the total mass of the resin composition.

The inorganic filler is preferably at least one selected from the group consisting of $Al_2O_3$, $SiO_2$, BN, AlN and $Si_3N_4$, with an average particle diameter of 1 to 100 nm. The epoxy resin is preferably a trifunctional epoxy resin.

The present invention also relates to a cured nanocomposite resin material obtained by thermosetting the insulating sealing resin composition for semiconductor modules.

The present invention further relates to a semiconductor module obtained by using the insulating sealing resin composition for semiconductor modules to seal an assembly comprising a metal block, an insulating layer pasted on one surface of the metal block, and at least one circuit element mounted on the other surface of the metal block. Sealing with the insulating sealing resin composition for semiconductor modules is preferably accomplished by any of potting, transfer molding or liquid transfer molding.

The insulating layer is preferably of an insulating material comprising an epoxy resin, a first inorganic filler with an average particle diameter of 1 to 99 nm dispersed in the epoxy resin and a second inorganic filler with an average particle diameter of 0.1 to 100 microns dispersed in the epoxy resin, wherein the first and second inorganic fillers are each independently at least one selected from the group consisting of $Al_2O_3$, $SiO_2$, BN, AlN and $Si_3N_4$, and the mixing ratios of the first and second inorganic fillers in the insulating material are 0.1 to 7 wt % and 80 to 95 wt %, respectively.

The present invention also relates to a method for manufacturing a semiconductor module, comprising a step of pasting an insulting layer on one surface of a metal block, a step of mounting at least one circuit element on the other surface of the same metal block, and a step of using the aforementioned insulating sealing resin composition for semiconductor modules to seal the assembly obtained by mounting the circuit element. The sealing step is preferably performed by any method selected from potting, transfer molding and liquid transfer molding.

With the resin composition of the present composition, a cured nanocomposite resin material can be obtained with improved heat resistance and a higher Tg, without altering the molecular structure of the resin. Moreover, high-temperature operations can be achieved with a semiconductor module, fuel cell, photovoltaic cell or other article manufactured using the resin composition of the present invention.

BRIEF DESCRIPTION OF THE DRAWINGS

The foregoing advantages and features of the invention will become apparent upon reference to the following detailed description and the accompanying drawing.

The sole FIGURE of drawing is a cross-sectional view illustrating one embodiment of a semiconductor module of the present invention and its manufacturing method.

DETAILED DESCRIPTION OF SPECIFIC EMBODIMENTS

Embodiments of the present invention are explained below. However, the present invention is not limited by the embodiments explained below.

The resin composition of the first embodiment of the present invention comprises a thermosetting resin, a curing agent and an inorganic filler. The type of the thermosetting resin is not specified, but an epoxy resin is particularly desirable.

The epoxy resin is not particularly limited, but for example bisphenol A epoxy resin, bisphenol F epoxy resin and other bifunctional epoxy resins, and phenol novolac epoxy resin, cresol novolac epoxy resin, bisphenol A novolac epoxy resin, bisphenol F novolac epoxy resin, naphthalene epoxy resin, biphenyl epoxy resin, dicyclopentadiene epoxy resin and other polyfunctional epoxy resins can be used alone or combined. Of these, a polyfunctional epoxy resin is especially desirable, and a trifunctional epoxy resin is most desirable.

The curing agent may be one commonly used as a curing agent for epoxy resins. In particular, an acid anhydride or a molecule containing one or more of the functional groups —$NH_3$, —$NH_2$ and —NH in its molecular structure can be used as the curing agent. Specific examples include diaminodiphenylmethane, diaminodiphenylsulfone and other aromatic amines, aliphatic amines, imidazole derivatives, dicyandiamide, tetramethyl guanidine and other guanidine curing agents, thiourea-added amine, adipic dihydrazide, isophthalic dihydrazide, dodecanoic dihydrazide and other dihydrazide curing agents, 2-ethyl-4-methylimidazole and other imidazole curing agents, and methyltetrahydrophthalic acid anhydride, tetrahydrophthalic acid anhydride, methylnadic anhydride, hexahydrophthalic anhydride, methylhexahydrophthalic anhydride and other acid anhydride curing agents and isomers and modified forms of these. One of these may be used alone as the curing agent, or a mixture of two or more may be used.

A curing aid can also be added in addition to the curing agent, for the purpose of controlling the curing reaction. Examples of curing aids include, but are not limited to, 2-ethyl-4-methylimidazole and other imdiazoles, benzyldimethylamine and other tertiary amines, triphenylphosphine and other aromatic phosphines, boron trifluoride monoethylamine and other Lewis acids, boric acid esters, organic metal compounds, metal salts of organic acids and the like.

The inorganic filler may be, but is not limited to, at least one selected from the group consisting of $Al_2O_3$, $SiO_2$, BN, AlN and $Si_3N_4$. $SiO_2$ is particularly desirable as the inorganic filler.

The inorganic filler of this embodiment may have an average particle diameter of 1 to 1000 nm, and preferably has an average particle diameter of 1 to 100 nm, or more preferably an average particle diameter of 3 to 50 nm, or most preferably an average particle diameter of 5 to 30 nm. To obtain a sufficient Tg elevating effect, the inorganic filler in this embodiment using a thermosetting resin preferably has an average particle diameter of 1 to 100 nm as discussed above. In this description, the average particle diameter is a value measured by laser diffraction.

The mixing ratio of the inorganic filler in the resin composition is preferably 0.1 to 10 wt %, or more preferably 1.5 to 6 wt %, given 100% as the weight of the resin composition before curing. If the mixing ratio of the inorganic filler is less than 0.1%, a sufficient Tg elevating effect may not be obtained. If the mixing ratio of the inorganic filler exceeds 10 wt %, on the other hand, the composition may become too viscous to be used as a casting material.

The mixing ratio of the curing agent is preferably 1 to 10 wt % given 100 wt % as the weight of the resin composition before curing. More specifically, the mixing ratio of the curing agent can be determined from the epoxy equivalents of the epoxy resin and the amine equivalents or acid anhydride equivalents of the curing agent. Even when a thermosetting resin other than an epoxy resin is used, the amount of the curing agent can be determined appropriately by a person skilled in the art based on the chemical equivalents of the resin and curing agent. When a curing aid is used, the mixing ratio of the curing aid is preferably 0.1 to 5 wt % given 100 wt % as the weight of the resin composition before curing. The mixing ratios of various raw materials in the resin composition of this embodiment were discussed above, and the remainder represents the mixing ratio of epoxy resin or thermosetting resin other than epoxy resin.

The method of manufacturing the resin composition of this embodiment includes a step of mixing the epoxy resin and inorganic filler in a specific mixing ratio, a step of dispersing the inorganic filler, and a step of adding a specific mixing ratio of the curing agent to the mixture with the dispersed inorganic filler, and moreover a step of kneading the mixture. The step of dispersing the inorganic filler can be accomplished for example using a pressurized orifice passage-type diffuser.

A cured nanocomposite resin material with a higher glass transition temperature than in the past is obtained by thermosetting the resin composition of this embodiment. In such a cured material, the filler is dispersed with an average inter-filler distance of preferably 1 to 200 nm or more preferably 1 to 100 nm. The inter-filler distance here means a value calculated from the distance between the central points of adjacent pairs of particles, measured under a transmission electron microscope (TEM). In the cured resin material of this embodiment, it is thought that a smaller average inter-filler distance contributes to raising the Tg by producing a greater intermolecular force. Thus, this resin composition can be used to seal a semiconductor element, producing an effective seal even if the heat generated in the semiconductor element reaches high temperatures.

The resin composition of the present invention can be used for insulation and internal protection not only in semiconductor elements, but also in photovoltaic cells, and in breakers and other electrical components and electrical products and the like. Possible modes of use include, but are not limited to, sealing materials or protective films for protecting the cells of photovoltaic cells, and cover materials for breaker.

Next, a cured nanocomposite resin material is explained. The cured nanocomposite resin material of this embodiment is obtained by curing the aforementioned resin composition. Curing can be accomplished in two stages. Such a cured nanocomposite resin material is manufactured as a unit with the semiconductor module in the semiconductor module manufacturing method described below.

The resin composition of the second embodiment of the present invention comprises a thermoplastic resin and an inorganic filler. The type of the thermoplastic resin is not limited, but a polyamide resin is preferred, and nylon 6, nylon 6,6 or nylon MXD is especially preferred.

The resin composition of the second embodiment uses a thermoplastic resin and an organic solvent in place of the thermosetting resin, curing agent and curing aid of the first embodiment. The filler may be similar to those explained above with respect to the first embodiment. In this embodiment, however, it is especially desirable to use an inorganic filler with an average particle diameter of 1000 nm or less. The added amount of the filler is preferably 0.1 to 10 wt % based on the total mass of the resin composition.

Preparation of the resin composition of the second embodiment comprises a step of dissolving the thermoplastic resin in an organic solvent, and a step of adding and dispersing a filler in the thermoplastic resin dissolved in the organic solvent. A phenol, cresol or the like can be used as the organic solvent, depending on the type of thermoplastic resin. When a nylon is used as the thermoplastic resin in particular, it is desirable to use hexafluoroisopropanol as the organic solvent. The organic solvent is preferably diluted by a factor of 1× to 1000×.

A cured resin material can be manufactured from the resin composition of the second embodiment by evaporating the organic solvent from the composition. In a cured material of this thermoplastic resin, the filler is preferably dispersed at an average inter-filler distance of 1 to 2000 nm or more preferably 1 to 1000 nm.

The semiconductor module of the third embodiment of the present invention is explained next. View (e) in the drawing FIGURE is a cross-section illustrating a semiconductor module of this embodiment. Semiconductor module 10 consists primarily of an assembly made up of metal block 2, insulating layer 3 and circuit element 4, sealed in a cured nanocomposite resin material 1 obtained by curing a resin composition.

Semiconductor module 10 of this embodiment is explained with reference to views (a) through (e), from the perspective of the manufacturing method. The method of manufacturing semiconductor module 10 comprises a step of pasting insulating layer 3 on one surface of metal block 2, a step of mounting at least one circuit element 4 on the other surface of metal block 2, and a step of sealing the assembly obtained by mounting the circuit element 4 with a resin composition.

As shown in view (a), a metal plate is first punched by pressing into a specific shape such as square or rectangular to prepare metal block 2. Cu, Mo or the like for example can be used for metal block 2. The thickness of metal block 2 is not particularly limited, but is preferably in the range of 1.0 to 6.0 mm.

In the step of pasting insulating layer 3 on one side of metal block 2, as shown in view (b), insulating layer 3 consisting of an insulating material is laid over one surface of metal block 2, and hot pressed to affix the two together. Insulating layer 3 is obtained by molding and curing an insulating material. In one embodiment, this is an insulating material comprising an epoxy resin, a first inorganic filler with an average particle diameter of 1 to 99 nm dispersed in the epoxy resin, and a second inorganic filler with an average particle diameter of 0.1 to 100 microns dispersed in the epoxy resin, wherein the first and second inorganic fillers are each independently at least one selected from the group consisting of $Al_2O_3$, $SiO_2$, BN, AlN and $Si_3N_4$, and the mixing ratios of the first and second inorganic fillers in the insulating material are 0.1 to 7 wt % and 80 to 95 wt %, respectively. The mixing ratio (wt %) of each component here is the wt % given 100% as the weight of the insulating material as a whole before curing.

In the step of mounting the at least one circuit element 4 on the other surface of metal block 2, as shown in view (c), a power semiconductor element, drive IC or other circuit element 4 is joined with solder to the other surface of metal block 2. Soldering is preferably performed using pellet solder in a hydrogen reduction-capable furnace. A hydrogen reduction-capable furnace is used in order to remove the oxide film on the surface of metal block 2 by hydrogen reduction, thereby activating the surface and improving wettability with the solder. A high-temperature solder such as SnPbAg or a lead-free solder such as SnAgCu is used as the solder material. The soldering temperature is set according to the melting point of the solder. If voids persist in the solder layer (not shown) between the power semiconductor element and the metal block, thermal resistance is increased, and the heat generated from the power semiconductor element cannot be efficiently dissipated. Therefore, vacuuming is preferably performed at 10 Torr or less with the solder in a molten state so as to prevent void generation.

In the step of mounting the circuit element, as shown in view (d), circuit element 4 is connected to lead frame 5 by bonding wire 6 to obtain a semiconductor element assembly. Al wire with a wire diameter of 125 to 500 microns is preferably used as bonding wire 6. Bonding wire 6 is preferably ultrasonically bonded.

Next, as shown in view (e), this assembly is sealed with cured nanocomposite resin material 1 obtained by molding and curing the resin composition of one embodiment of the present invention by specific methods. Sealing can be accomplished by any method selected from potting, transfer molding, liquid transfer molding, compression molding or injection molding.

When sealing is accomplished by transfer molding, the assembly shown in view (d) is set in a mold attached to a transfer molder, and a resin composition in pellet form is injected with a plunger into the pre-heated mold, cured for tens of seconds, and then immediately removed from the mold and post-cured in a thermostatic tank to complete the sealing process. The mold preferably is maintained at a temperature of 170 to 180° C. The advantage of transfer molding is that it is inexpensive and suited to mass production because injection and curing can be accomplished in a short amount of time.

When sealing is by liquid transfer molding, the assembly shown in view (d) is set in a high-temperature mold, and the resin composition in a liquid state is injection molded and heat cured in the mold. With the mold maintained at 170 to 180° C., the composition is cured in the mold, and post-cured in a thermostatic tank to complete the sealing process. Liquid transfer molding also has the advantage of high productivity because it can be accomplished in a short amount of time.

When sealing is accomplished by potting, the assembly shown in view (d) is set in a case, and the resin composition in a liquid state is poured in with a dispenser to seal the assembly.

With the semiconductor module and manufacturing method thereof this embodiment, it is possible to seal a semiconductor element assembly using the resin composition of one embodiment of the present invention, thereby providing a highly heat-resistant semiconductor module.

EXAMPLES

Resin compositions of the present invention and resin compositions of comparative examples were prepared, and heat cured to manufacture cured nanocomposite resin materials.

Epoxy resin and inorganic filler were mixed in the proportions shown in Table 1, and the inorganic filler was dispersed using a pressurized orifice passage-type diffuser. A curing agent was added in the proportions shown in Table 1 to the mixtures with the dispersed inorganic filler. These were further kneaded to obtain resin compositions and compositions of the comparative examples. The mixing ratios (wt %) in Table 1 represent the mixing ratios (wt %) of each component given 100% as the weight of the resin composition as a whole before curing.

Each of the compositions was heat cured under the conditions shown in Table 1 to manufacture a cured nanocomposite resin material.

The glass transition temperatures of the resulting cured nanocomposite resin materials were evaluated by differential scanning calorimetry. The glass transition temperatures were evaluated using a differential scanning calorimeter (DSC6200, SII Co.) at a programming rate of 10° C./min in the range of 25 to 270° C., with 35 ml/min of $N_2$ gas.

The compositions of the resin compositions used in Examples 1 and 2 and Comparative Examples 1 and 2 are shown in Table 1 together with the curing conditions and the measurement results for the physical properties of the cured resin materials.

TABLE 1

|  |  | Ex. 1 | Ex. 2 | CE. 1 | CE. 2 |
|---|---|---|---|---|---|
| Composition of resin composition | Epoxy resin 1 (wt %) | 72.8 | — | 75.8 | — |
|  | Epoxy resin 2 (wt %) | — | 60.2 | — | 62.2 |
|  | Inorganic filler (wt %) | 3.9 | 3.2 | — | — |
|  | Curing agent 1 (wt %) | 23.3 | 36.6 | 24.2 | 37.8 |
| Curing conditions |  | 80° C. × 1 h 150° C. × 3 h | 80° C. × 3 h 150° C. × 6 h | 80° C. × 1 h 150° C. × 3 h | 80° C. × 3 h 150° C. × 6 h |
| Properties of cured resin material: Tg (° C.) |  | 153 | 223 | 149 | 190 |

The raw materials used in these examples were as follows.

Epoxy resin 1 (JER828®, Mitsubishi Chemical, BisA epoxy resin, epoxy equivalent 194)

Epoxy resin 2 (JER630®, Mitsubishi Chemical, polyfunctional epoxy resin, epoxy equivalent 105)

Inorganic filler (Aerosil® 200, Nippon Aerosil, silica, average particle diameter 12 nm)

Curing agent 1 (Jercure® 113, Mitsubishi Chemical, denatured amine curing agent)

Curing agent 2 (Jercure® 307, Mitsubishi Chemical, acid anhydride curing agent)

Curing aid 1 (EMI24®, Mitsubishi Chemical, imidazole curing accelerator)

A BisA epoxy resin was used as the epoxy resin in both Example 1 and Comparative Example 1. The difference was that an inorganic filler was compounded in Example 1 but not in Comparative Example 1. Table 1 confirms that adding an inorganic filler had the effect of raising the Tg by a few degrees centigrade. A trifunctional epoxy resin was used as the epoxy resin in both Example 2 and Comparative Example 2. The difference was that an inorganic filler was compounded in Example 2 but not in Comparative Example 2. Table 1 confirms that adding an inorganic filler had the effect of raising the Tg by 33° C.

Next, resin compositions were prepared as in Examples 1 and 2 and Comparative Examples 1 and 2 above using an acid anhydride curing agent as the curing agent. These compositions were then heat cured to obtain cured nanocomposite resin materials. The inorganic filler was the same as that used above. The glass transition temperature was evaluated as before. The compositions of the resin compositions used in Example 3 and Comparative Example 3 are shown in Table 2 together with the curing conditions and the measurement results for the physical properties of the cured resin materials.

TABLE 2

|  |  | Ex. 3 | CE. 3 |
|---|---|---|---|
| Composition of resin composition | Polyfunctional epoxy resin (wt %) | 48.25 | 50.0 |
|  | Inorganic filler (wt %) | 3.5 | — |
|  | Acid anhydride curing agent (wt %) | 48.25 | 50.0 |
| Curing conditions |  | 100° C. × 2 h 180° C. × 2 h | 100° C. × 2 h 180° C. × 2 h |
| Properties of cured resin material: Tg (° C.) |  | 221 | 210 |

Even using an acid anhydride curing agent as the curing agent, an increase in the Tg of the cured nanocomposite resin material was seen when an inorganic filler was added. A Tg elevating effect was seen regardless of the type of epoxy resin, but the increase in the Tg of the cured nanocomposite resin material from addition of the organic filler was greater when a trifunctional epoxy resin was used.

Next, liquid resin was coated on a quartz plate mimicking the filler, and cured to prepare the samples of Example 4 and Example 5. An epoxy resin was used as a thermosetting resin in Example 4, while nylon was used as a thermoplastic resin in Example 5. The properties exhibited by these samples mimic the interactions of the filler with the resin in the cured resin material of the present invention. That is, the interactions between the quartz plate and the resin at a specific distance from the quartz plate are similar, on a macro level, to those between the filler and the resin in the cured resin material of the present invention, reflecting the former interactions.

Specifically, in the sample of Example 4, a sample was obtained by coating a quartz plate with a mixture of 110 parts by weight of the curing agent 2 and 1 part by weight of the curing aid 1 with 100 parts by weight of the epoxy resin 1 used in Example 1 as the epoxy resin. In the sample of Example 5, a quartz plate was coated with nylon dissolved in an organic solvent to make a sample. Nylon MXD6 (Mitsubishi Gas Chemical) was used as the nylon, while the organic solvent was hexafluoroisopropanol.

After the epoxy resin and nylon had been coated on the quartz plates, the resin was cured and the organic solvent was vaporized by heating to 80 to 100° C., to thereby prepare cured films of resin on the quartz plates, and the resin was cut diagonally to make evaluation samples.

The glass transition temperatures and melting points of the resulting samples of Example 4 and Example 5 were measured with a Seiko Instruments Nanothermal Microscope. Measurement results are shown in Tables 3 and 4.

The glass transition temperature of the epoxy resin was evaluated. The measurement results are shown in Table 3. The glass transition temperature rose by 17° C. as the thickness of the epoxy resin on the quartz plate decreased from 200 nm to a distance of 40 nm. The thickness of the epoxy resin in the sample of this Example 4 corresponds to the midpoint of the inter-filler distance in the cured resin material of the present invention.

TABLE 3

|  | Thickness of epoxy resin on quartz (nm) | | | |
|---|---|---|---|---|
|  | 200 | 100 | 70 | 40 |
| Glass transition temperature of epoxy resin (° C.) | 70 | 80 | 80 | 87 |

The melting point of the nylon was evaluated, with the measurement results shown in Table 4. The melting point was confirmed to rise by 55.4° as the thickness of the nylon on the quartz plate decreased from 4000 nm to 92 nm. The thickness of the nylon in the sample of this Example 5 corresponds to the midpoint of the inter-filler distance in the cured resin material of the present invention.

TABLE 4

|  | Thickness of nylon on quartz (nm) | | | | | | |
|---|---|---|---|---|---|---|---|
|  | 4000 | 1934 | 1742 | 1066 | 522 | 323 | 92 |
| Melting point of nylon (° C.) | 205.4 | 220.1 | 235.6 | 236.5 | 235.9 | 254.4 | 260.8 |

With the resin composition of the present invention it is possible to effectively seal even a semiconductor element in which the generated heat reaches high temperatures, making this extremely useful for manufacturing semiconductor modules, and for insulation and internal protection of a variety of electrical components and electrical products.

Thus, a resin composition and its method of manufacture have been described according to the present invention. Many modifications and variations may be made to the techniques and structures described and illustrated herein without departing from the spirit and scope of the invention. Accordingly, it should be understood that the compositions and methods described herein are illustrative only and are not limiting upon the scope of the invention.

EXPLANATION OF REFERENCE NUMERALS

1 Cured nanocomposite resin material
2 Metal block
3 Insulating layer
4 Circuit element
5 Lead frame
6 Bonding wire
10 Semiconductor module

What is claimed is:

1. A resin composition comprising:
   (i) an epoxy resin,
   (ii) a curing agent,
   (iii) a first inorganic filler having an average particle diameter of 1 to 99 nm and dispersed in the epoxy resin, and
   (iv) a second inorganic filler having an average particle diameter of 0.1 to 100 microns and dispersed in the epoxy resin,
   wherein mixing ratios of the first and second inorganic fillers in the epoxy resin are 0.1 to 7 wt % and 80 to 95 wt %, respectively.

2. The resin composition according to claim 1, wherein the first and second inorganic filler are each independently at least one selected from the group consisting of $Al_2O_3$, $SiO_2$, BN, AlN and $Si_3N_4$.

3. The resin composition according to claim 2, wherein the curing agent is an acid anhydride curing agent or a curing agent containing a molecule having 1 or more of functional groups —NH$_3$, —NH$_2$ and —NH in a molecular structure thereof.

4. The resin composition according to claim 2, wherein the epoxy resin is a trifunctional epoxy resin.

5. A cured nanocomposite resin material obtained by thermosetting the resin composition according to claim 2.

6. The cured nanocomposite resin material according to claim 5, wherein an average inter-filler distance is 1 to 200 nm.

7. The cured nanocomposite resin material according to claim 5, wherein the average inter-filler distance is 1 to 2000 nm.

8. The resin composition according to claim 1, wherein the curing agent is an acid anhydride curing agent or a curing agent containing a molecule having 1 or more of functional groups —NH$_3$, —NH$_2$ and —NH in a molecular structure thereof.

9. The resin composition according to claim 1, wherein the epoxy resin is a trifunctional epoxy resin.

10. A cured nanocomposite resin material obtained by thermosetting the resin composition according to claim 1.

11. The cured nanocomposite resin material according to claim 10, wherein an average inter-filler distance is 1 to 200 nm.

12. The cured nanocomposite resin material according to claim 10, wherein the average inter-filler distance is 1 to 2000 nm.

13. A sealed semiconductor module comprising:
a metal block,
an insulating layer pasted over one surface of the metal block;
at least one circuit element mounted on the other surface of the metal block, and
a seal over the circuit element formed by curing a resin composition comprising
(i) an epoxy resin,
(ii) a curing agent,
(iii) a first inorganic filler having an average particle diameter of 1 to 99 nm and dispersed in the epoxy resin, and
(iv) a second inorganic filler having an average particle diameter of 0.1 to 100 microns and dispersed in the epoxy resin,
wherein mixing ratios of the first and second inorganic fillers in the epoxy resin are 0.1 to 7 wt % and 80 to 95 wt %, respectively.

14. The semiconductor module according to claim 13, wherein the seal is accomplished by any of potting, transfer molding and liquid transfer molding.

15. A semiconductor module comprising:
a metal block,
an insulating layer pasted over one surface of the metal block;
at least one circuit element mounted on the other surface of the metal block,
wherein the insulating layer is a resin composition comprising:
(i) an epoxy resin,
(ii) a curing agent,
(iii) a first inorganic filler having an average particle diameter of 1 to 99 nm and dispersed in the epoxy resin, and
(iv) a second inorganic filler having an average particle diameter of 0.1 to 100 microns and dispersed in the epoxy resin,
wherein mixing ratios of the first and second inorganic fillers in the epoxy resin are 0.1 to 7 wt % and 80 to 95 wt %, respectively.

16. A method for manufacturing a semiconductor module, comprising:
a step of pasting an insulting layer on one surface of a metal block;
a step of mounting at least one circuit element on the other surface of the metal block; and
a step of sealing an assembly obtained by mounting the circuit element by curing a resin composition comprising:
(i) an epoxy resin,
(ii) a curing agent,
(iii) a first inorganic filler having an average particle diameter of 1 to 99 nm and dispersed in the epoxy resin, and
(iv) a second inorganic filler having an average particle diameter of 0.1 to 100 microns and dispersed in the epoxy resin,
wherein mixing ratios of the first and second inorganic fillers in the epoxy resin are 0.1 to 7 wt % and 80 to 95 wt %, respectively.

17. The manufacturing method according to claim 16, wherein the sealing step is accomplished by a method selected from potting, transfer molding, liquid transfer molding, compression molding and injection molding.

* * * * *